US008450835B2

(12) United States Patent
Chen et al.

(10) Patent No.: US 8,450,835 B2
(45) Date of Patent: May 28, 2013

(54) REVERSE LEAKAGE REDUCTION AND VERTICAL HEIGHT SHRINKING OF DIODE WITH HALO DOPING

(75) Inventors: Xiying Chen, San Jose, CA (US); Mark H. Clark, Santa Clara, CA (US); S. Brad Herner, San Jose, CA (US); Tanmay Kumar, Pleasanton, CA (US)

(73) Assignee: SanDisk 3D LLC, Milpitas, CA (US)

( * ) Notice: Subject to any disclaimer, the term of this patent is extended or adjusted under 35 U.S.C. 154(b) by 239 days.

(21) Appl. No.: 12/149,217

(22) Filed: Apr. 29, 2008

(65) Prior Publication Data

US 2009/0268508 A1 Oct. 29, 2009

(51) Int. Cl.
*H01L 29/06* (2006.01)

(52) U.S. Cl.
USPC ..... 257/656; 257/104; 257/109; 257/E21.459

(58) Field of Classification Search
USPC .................. 257/656, 104, 109, 110, E21.459
See application file for complete search history.

(56) References Cited

U.S. PATENT DOCUMENTS

| 2,899,646 A | | 8/1959 | Read, Jr. |
| 3,638,082 A | * | 1/1972 | Mizushima et al. ......... 257/110 |
| 4,646,266 A | | 2/1987 | Ovshinsky et al. |
| 4,665,428 A | | 5/1987 | Hockley et al. |
| 5,360,990 A | * | 11/1994 | Swanson ...................... 257/656 |
| 5,432,729 A | | 7/1995 | Carson et al. |
| 5,559,732 A | | 9/1996 | Birge |
| 5,693,556 A | | 12/1997 | Cleeves |
| 5,745,407 A | | 4/1998 | Levy et al. |
| 5,751,012 A | | 5/1998 | Wolstenholme et al. |
| 5,835,396 A | | 11/1998 | Zhang |
| 5,915,167 A | | 6/1999 | Leedy |
| 5,962,911 A | | 10/1999 | Manley |
| 5,991,193 A | | 11/1999 | Gallagher et al. |
| 6,034,882 A | | 3/2000 | Johnson et al. |
| 6,111,784 A | | 8/2000 | Nishimura et al. |
| 6,236,587 B1 | | 5/2001 | Gudesen et al. |
| 6,306,718 B1 | | 10/2001 | Singh et al. |
| 6,420,215 B1 | | 7/2002 | Knall et al. |
| 6,483,736 B2 | | 11/2002 | Johnson et al. |
| 6,486,065 B2 | | 11/2002 | Vyvoda et al. |
| 6,525,953 B1 | | 2/2003 | Johnson |

(Continued)

FOREIGN PATENT DOCUMENTS

| EP | 1 450 373 | 8/2004 |
| GB | 1 263 626 | 2/1972 |
| WO | WO 2004/055827 | 7/2004 |

OTHER PUBLICATIONS

U.S. Appl. No. 10/095,962, filed Mar. 13, 2002, Herner et al.

(Continued)

*Primary Examiner* — Jack Chen
(74) *Attorney, Agent, or Firm* — The Marbury Law Group PLLC

(57) ABSTRACT

One embodiment of the invention provides a semiconductor diode device including a first conductivity type region, a second conductivity type region, where the second conductivity type is different from the first conductivity type, an intrinsic region located between the first conductivity type region and the second conductivity type region; a first halo region of the first conductivity type located between the second conductivity type region and the intrinsic region, and optionally a second halo region of the second conductivity type located between the first conductivity type region and the intrinsic region.

12 Claims, 4 Drawing Sheets

U.S. PATENT DOCUMENTS

| | | | |
|---|---|---|---|
| 6,541,312 B2 | 4/2003 | Vyvoda et al. | |
| 6,567,301 B2 | 5/2003 | Anthony et al. | |
| 6,584,029 B2 | 6/2003 | Tran et al. | |
| 6,677,220 B2 | 1/2004 | Van Brocklin et al. | |
| 6,693,823 B2 | 2/2004 | Brown | |
| 6,777,773 B2 | 8/2004 | Knall | |
| 6,881,994 B2 | 4/2005 | Lee et al. | |
| 6,946,719 B2 | 9/2005 | Petti et al. | |
| 6,951,780 B1 | 10/2005 | Herner | |
| 6,952,030 B2 | 10/2005 | Herner et al. | |
| 6,952,043 B2 | 10/2005 | Vyvoda et al. | |
| 7,038,248 B2 | 5/2006 | Lee | |
| 7,176,064 B2 | 2/2007 | Herner | |
| 7,285,464 B2 | 10/2007 | Herner et al. | |
| 2003/0001230 A1 | 1/2003 | Lowrey | |
| 2004/0016991 A1 | 1/2004 | Herner et al. | |
| 2004/0228159 A1 | 11/2004 | Kostylev et al. | |
| 2004/0232509 A1 | 11/2004 | Vyvoda et al. | |
| 2005/0052915 A1 | 3/2005 | Herner et al. | |
| 2005/0098800 A1 | 5/2005 | Herner et al. | |
| 2005/0121742 A1 | 6/2005 | Petti et al. | |
| 2005/0158950 A1 | 7/2005 | Scheuerlein et al. | |
| 2006/0250836 A1 | 11/2006 | Herner et al. | |
| 2006/0250837 A1 | 11/2006 | Herner et al. | |
| 2007/0072360 A1 | 3/2007 | Kumar et al. | |
| 2007/0114509 A1 | 5/2007 | Herner | |
| 2008/0007989 A1 | 1/2008 | Kumar et al. | |
| 2009/0057717 A1* | 3/2009 | Rodrigues | 257/173 |

OTHER PUBLICATIONS

U.S. Appl. No. 10/185,507, filed Jun. 27, 2002, Vyvoda et al.
U.S. Appl. No. 10/440,882, filed May 19, 2003, Vyvoda et al.
U.S. Appl. No. 10/728,436, filed Dec. 5, 2003, Chen.
U.S. Appl. No. 10/728,451, filed Dec. 5, 2003, Cleeves et al.
U.S. Appl. No. 10/815,312, filed Apr. 1, 2004, Chen.
U.S. Appl. No. 10/883,417, filed Jun. 30, 2004, Raghuram et al.
U.S. Appl. No. 10/954,510, filed Sep. 29, 2004, Herner.
U.S. Appl. No. 11/148,530, filed Jun. 8, 2006, Herner et al.
U.S. Appl. No. 11/395,995, filed Mar. 31, 2006, Herner et al.
U.S. Appl. No. 11/444,936, filed May 31, 2006, Radigan et al.
U.S. Appl. No. 11/693,858, filed Mar. 30, 2007, Kumar et al.
U.S. Appl. No. 11/819,078, filed Jun. 25, 2007, Herner.
U.S. Appl. No. 12/007,780, filed Jan. 15, 2008, Herner et al.
U.S. Appl. No. 12/007,781, filed Jan. 15, 2008, Vance et al.
International Search Report and Written Opinion mailed Jul. 2, 2009, received in International Application No. PCT/US2009/002402.
D. Caputo et al., "Evidence of Hysteresis in a New p-i-n-i-p-i-n Amorphous Silicon Device," Materials Research Society Symposium Proceedings, vol. 467, (1997), pp. 943-948.
P.P. Maksymov, "Static electrical fields of reverse-biased GaAs- and Ge-*pnipn* structures," Physics and Engineering of Millimeter and Sub-Millimeters Waves, 2001, The Fourth International Kharkov Symposium, Jun. 4-9, 2001, pp. 777-779.
International Bureau of WIPO. International Preliminary Report on Patentability, Intl. Application PCT/US09/02402. Nov. 11, 2010. 10 pages.

* cited by examiner

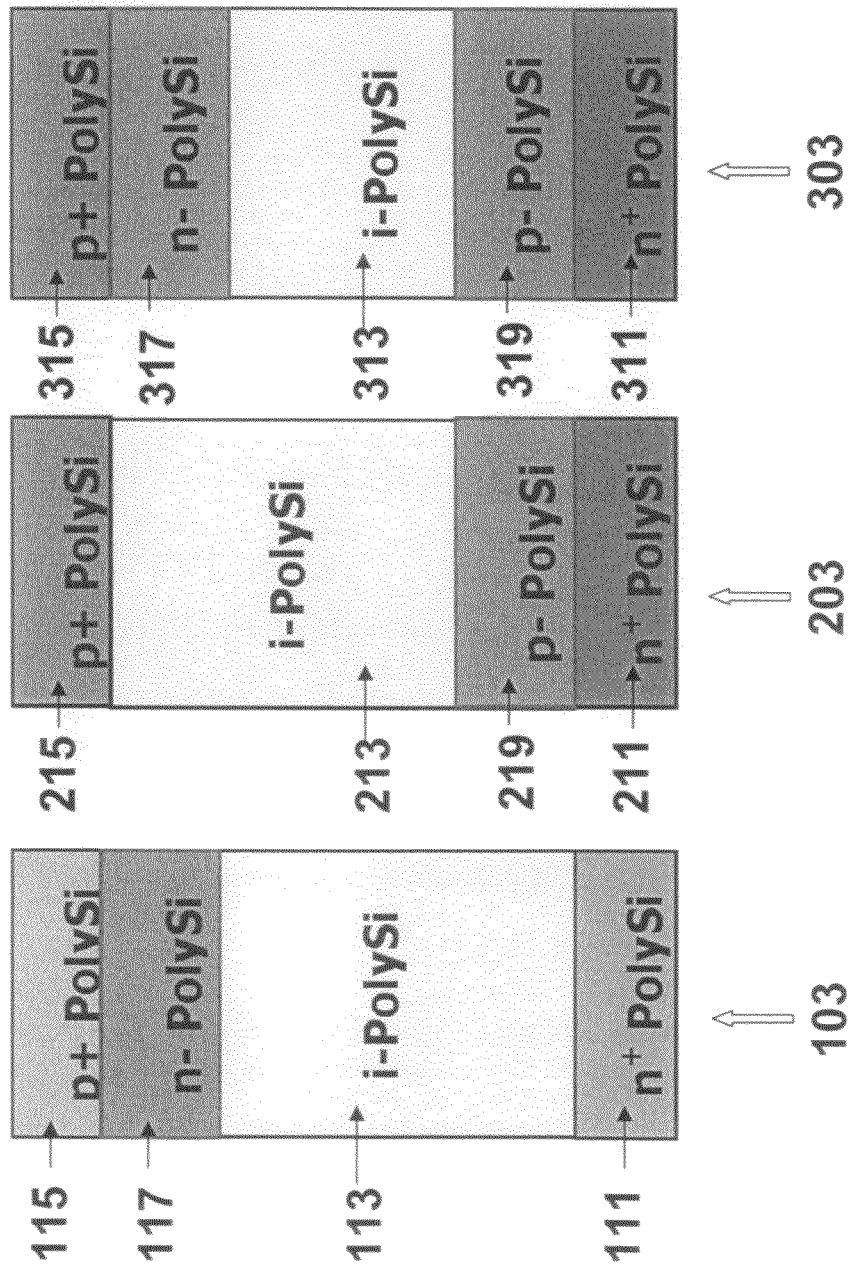

REVERSE LEAKAGE REDUCTION AND VERTICAL HEIGHT SHRINKING OF DIODE WITH HALO DOPING

FIELD OF THE INVENTION

The present invention relates generally to the field of semiconductor device processing, and specifically to a diode and a method of making thereof.

BACKGROUND

As shown in FIG. 1a, a memory unit cell 1 is composed of a steering element 3 and a storage element 5 connected in series between a bit line 7 and a word line 9. Herner et al., U.S. patent application Ser. No. 10/955,549 filed Sep. 29, 2004 (which corresponds to US Published Application 2005/0052915 A1), Herner et al., U.S. patent application Ser. No. 11/015,824 filed Dec. 17, 2004, and U.S. patent application Ser. No. 11/819,078 filed Jul. 25, 2007, each hereby incorporated by reference, describe a three dimensional memory array which comprises memory cells with pillar shaped semiconductor junction diodes as the steering elements. As shown in FIG. 1a, this steering element 3 made from a diode has two terminals, and can be used with any two-terminal storage element 5. The diode 3 is shown in more detail in FIG. 1b, and contains an $n^+$ region 11, an intrinsic region 13, and a $p^+$ region 15, and is referred to a p-i-n diode. This vertical architecture can be used in a one time programmable (OTP) memory product with a higher density and simpler architecture and process. With relentless scaling requirement in the semiconductor industry, especially in the memory area, power consumption is one of biggest challenges. The conventional p-i-n diode 3 suffers relatively high reverse leakage due to a large depletion region.

SUMMARY

One embodiment of the invention provides a semiconductor diode device comprising a first conductivity type region, a second conductivity type region, wherein the second conductivity type is different from the first conductivity type, an intrinsic region located between the first conductivity type region and the second conductivity type region, a first halo region of the first conductivity type located between the second conductivity type region and the intrinsic region, and optionally a second halo region of the second conductivity type located between the first conductivity type region and the intrinsic region.

BRIEF DESCRIPTION OF THE DRAWINGS

FIGS. 2a to 2c are schematic side cross sectional views of a diode with one or more halo doping regions according to embodiments of the invention.

DETAILED DESCRIPTION OF THE PREFERRED EMBODIMENTS

Figures 1A, 1B:
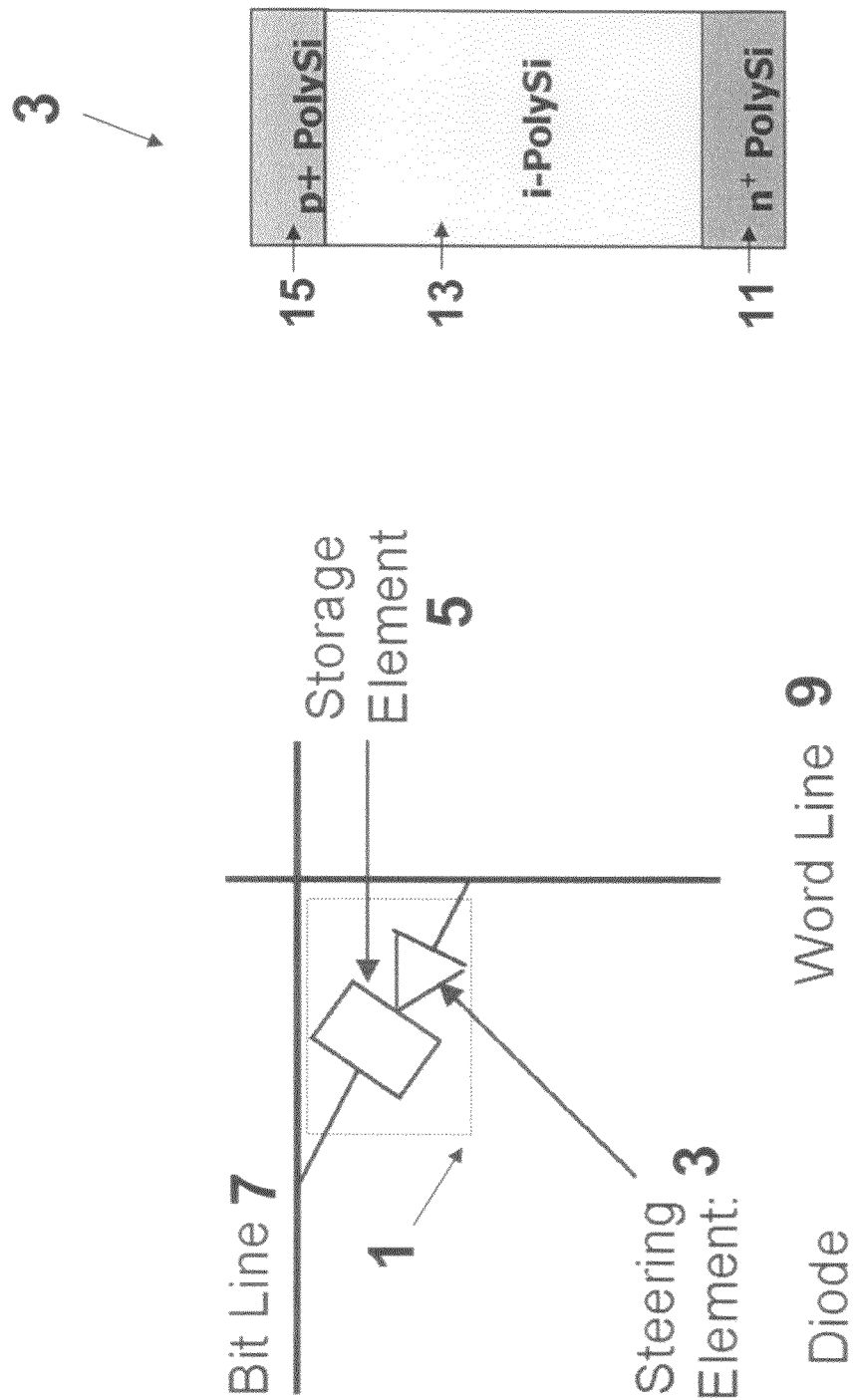
FIG. 1a is schematic of a prior art memory unit cell with a storage element and a steering element.
FIG. 1b is a schematic side cross section view of a prior art p-i-n diode used as the steering element in the memory unit cell.

One embodiment of the invention provides a semiconductor diode device in which a lightly doped halo region of the one conductivity type is located between a heavily doped region of the opposite conductivity type and an intrinsic region.

In one embodiment, the regions of the diode can be arranged vertically in series, and the diode has a substantially cylindrical shape. However, the regions may be arranged horizontally and/or the diode may have shapes other than cylindrical. In non-limiting examples shown in FIGS. 2a to 2c, one or more halo doping regions can be added to the prior art p-i-n diode (shown in FIG. 1b) to form diodes with $p^+$-$n^-$-i-$n^+$, $p^+$-i-$p^-$-n+, or $p^+$-$n^-$-i-$p^-$-$n^+$ configurations. They can also be arranged in $n^+$-i-$n^-$-$p^+$, $n^+$-$p^-$-i-$p^+$, and $n^+$-$p^-$-i-$n^-$-$p^+$ configurations. For example, FIG. 2a shows a diode 103 with a $n^+$-i-$n^-$-$p^+$ configuration, which contains a heavily doped $n^+$ region 111, an intrinsic region 113, a lightly doped $n^-$ halo region 117, and a heavily doped $p^+$ region 115. FIG. 2b shows a diode 203 with a $n^+$-$p^-$-i-$p^+$ configuration, which contains a heavily doped $n^+$ region 211, a lightly doped $p^-$ halo region 219, an intrinsic region 213, and a heavily doped $p^+$ region 215. FIG. 2c shows a diode 303 with a $n^+$-$p^-$-i-$n^-$-$p^+$ configuration, which contains a heavily doped $n^+$ region 311, a lightly doped $p^-$ halo region 319, an intrinsic region 313, a lightly doped $n^-$ halo region 317, and a heavily doped $p^+$ region 315.

The semiconductor materials used in this diode device can be silicon, germanium, silicon germanium, or other Group IV or III-V semiconductor materials.

The bottom first conductivity type region 111, 211, 311 can be a $p^+$ or $n^+$ type region, while the top second conductivity type region 115, 215, 315 can be a $n^+$ or $p^+$ type region, respectively. These first and second conductivity type regions can have a doping concentration higher than $1 \times 10^{19}$ cm$^{-3}$ and a thickness of 5 angstroms to 1 micron, preferably over 50 angstroms, for example about 200 to 500 angstroms, allowing good Ohmic contacts. The intrinsic region located in the middle of the diode can have a thickness of about 1100 to about 3300 angstroms, such as about 1500 to 2500 angstroms thick. However, the intrinsic region thickness may be reduced below 1000 angstroms, with appropriate device scaling. The thickness of the halo region or regions (n-region 117 in FIG. 2a, p-region 219 in FIG. 2b, and n- and p-regions 317, 319 in FIG. 2c) can be a few hundred angstroms, for example ranging from 10 angstroms to 3 microns, such as from 100 angstroms to 300 angstroms. Doping concentration of the halo region or regions is lower than that of the heavily doped regions and several orders higher than that of the intrinsic region, for example ranging from $1 \times 10^{17}$ cm$^{-3}$ to $1 \times 10^{19}$ cm$^{-3}$, preferably from $1 \times 10^{17}$ cm$^{-3}$ to $1 \times 10^{18}$ cm$^{-3}$. Consequently, the total height of the diode can be reduced to less than one thousand angstroms if the lower ends of the thickness ranges described above are selected for each region.

Figure 3:
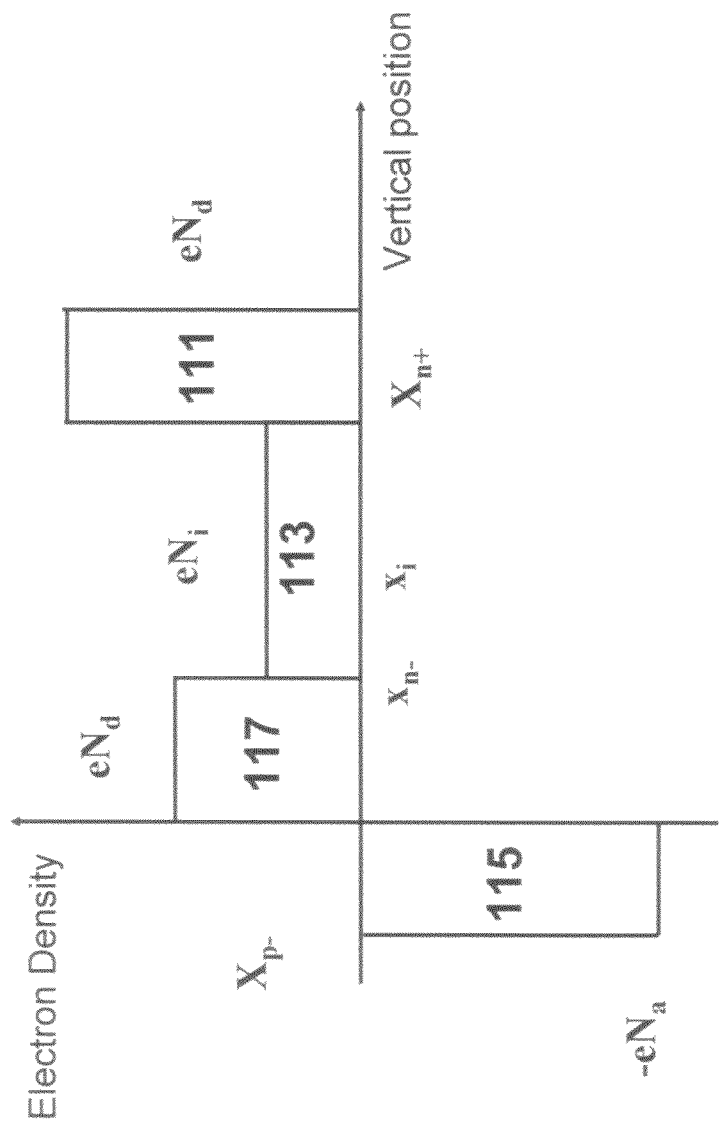
FIG. 3 shows a space charge density plot in a uniformly doped $p^+$-$n^-$-i-$n^+$ diode under the abrupt junction approximation, assuming that the intrinsic region is not completely depleted.

FIG. 3 diagrams the space charge density in a uniformly doped $p^+$-$n^-$-i-$n^+$ diode, assuming the abrupt junction approximation and assuming that the intrinsic region is not completely depleted. Equation 1 below is the electrostatic potential with no external bias applied. It is derived by solving the Poisson equation, using the fact that electrostatic potential continues at each boundary. An analytical solution of depletion width dependence on reverse bias can be derived from those equations.

$$\Phi(x) = \begin{cases} \dfrac{eN_a}{2\varepsilon_0\varepsilon_s}(x+x_p)^2 \to -x_p \leq x \leq 0 \\ -\dfrac{eN_d x^2}{2\varepsilon_0\varepsilon_s} + \dfrac{eN_d x_{n-}}{\varepsilon_0\varepsilon_s}x + \dfrac{eN_i(x_n - x_{n-})}{\varepsilon_0\varepsilon_s}x + \dfrac{eN_a x_p^2}{2\varepsilon_0\varepsilon_s} \to 0 \leq x \leq x_{n-} \\ -\dfrac{eN_i x^2}{2\varepsilon_0\varepsilon_s} + \dfrac{eN_i x_n x}{\varepsilon_0\varepsilon_s} + \dfrac{eN_d x_{n-}^2}{2\varepsilon_0\varepsilon_s} - \dfrac{eN_i x_{n-}^2}{2\varepsilon_0\varepsilon_s} + \dfrac{eN_a x_p^2}{2\varepsilon_0\varepsilon_s} \to x_{n-} \leq x \leq x_n \end{cases}$$

Equation 1

Another embodiment of the invention provides a nonvolatile memory device, comprising at least one memory cell which comprises a steering element, a storage element, a first electrode and a second electrode (connected respectively to bit line 7 and word line 9 shown in FIG. 1a) electrically contacting the at least one memory cell. The steering element comprises the diode 103, 203, or 303 with one or more halo regions. The memory cell can be a one time programmable read/write memory cell or a rewritable memory cell. In one embodiment, the nonvolatile memory device comprises a monolithic, three dimensional array of memory cells.

The storage element 5 can be at least one of antifuse, fuse, semiconductor resistor or diode (including but not limited to a polysilicon memory effect cell), metal oxide memory, switchable complex metal oxide, carbon nanotube memory, graphene switchable resistance material, phase change material memory, conductive bridge element, or switchable polymer memory. In some embodiments, the storage element of the memory cell can comprise a resistivity switching element. In some embodiments, the resistivity switching element comprises a metal oxide antifuse dielectric layer, such that the diode (103, 203, or 303) and the metal oxide antifuse dielectric layer 5 are arranged in series between the first 7 and the second 9 electrodes. Alternatively the switching element 5 may comprise an amorphous or polycrystalline Group IV semiconductor resistor, such as a polysilicon resistor. Switching elements such as high resistivity diodes in the form of polysilicon memory effect cell can also be used. The steering element 3 preferably comprises a crystallized, low resistivity polycrystalline Group IV semiconductor diode 103, 203, 303 with one or more halo regions.

When the memory cell comprises a resistivity switching element, the resistor material can be converted from an initial first resistivity state to a different resistivity state; then, upon application of an appropriate electrical pulse, can be returned to the first resistivity state. By applying appropriate electrical pulses, the memory cell can achieve two or more stable resistivity states. For example, the first state may be a higher resistivity state than the second state. Alternatively, the second state may be a lower state than the first resistivity state. The memory cell can have two or more data states, and can be one-time-programmable or rewriteable.

The resistivity switching element 5 can be located in contact with or be decoupled from the diode steering element 3. The resistivity switching element may be decoupled from the steering element by one or more conductive layers, such as metal (Ti, W, etc.), metal silicide or metal nitride, such as titanium nitride, layers, which are located between the switching and steering elements. The switching element 5, the steering element 3 and the conductive decoupling layer are arranged in series form the non-volatile memory cell 1.

Figure 4:
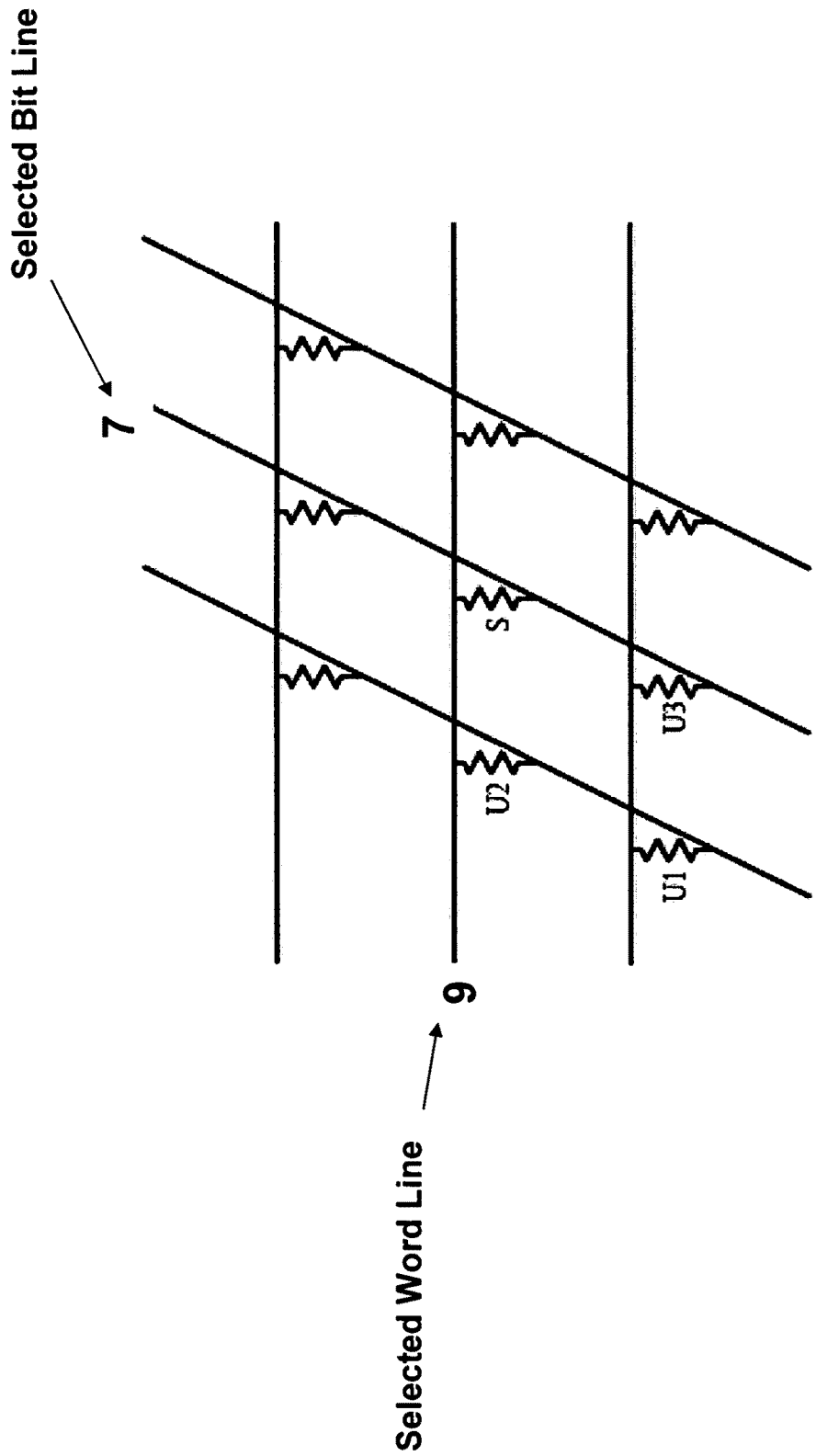
FIG. 4 is a circuit diagram of a memory array illustrating the need for electrical isolation between memory cells in a memory array.

Turning to FIG. 4, as a non-limiting example, suppose a voltage is applied between bit line 7 and word line 9 to set, reset, or sense selected cell S. When operating in read mode, the potential of unselected bit lines can be set at 0 volt with selected bit line at Vrd, and unselected word lines can be set at Vrd with selected word line at 0 volt. When operating in write (or set) mode, the potential of unselected bit lines can be set at Vub with selected bit line at VWr, and unselected word lines can be set at VUx with selected word line at 0V. When the diode materials are polycrystalline silicon, VUx can be set to around 0.7V lower than Vwr, with Vub set to around 0.7V. Current is intended to flow through selected cell S. Some leakage current, however, may flow on alternate paths, for example between bit line 7 and word line 9 through unselected cells U1, U2, and U3. Many such alternate paths may exist. This reverse leakage results in a voltage drop along the word line. If the voltage drop is large enough, the unselected bit under the selected bit line might be programmed or erased unexpectedly (in the set-reset operation), or might turn into a forward condition and result in a read current unexpectedly (in the read operation).

This leakage current can be greatly reduced using a diode with one or more halo regions to replace prior art $p^+$-i-$n^+$ diode as a steering element of the memory cell. The reverse leakage in material is dominated by the generation current which is proportional to the depletion width. With one or more halo doping regions added, the depletion width is reduced under the reverse bias condition. Consequently, the reverse leakage is decreased. Alternatively, the decreased leakage can be obtained by doping intrinsic region. However, an intentional doping of intrinsic region may result in early breakdown due to tunneling current or any enhanced current related to strong field. Thus, adding one or more halo doping regions to the diode reduces the reverse leakage while avoiding the early breakdown. Furthermore, the height of the diode can be reduced to less than one thousand angstroms without early breakdown.

The layers of diodes can be formed by any deposition method, such as Chemical Vapor Deposition (CVD). The doped layers can be doped by in situ doping. Alternatively, the regions above the intrinsic region can be formed by ion implantation into intrinsic region, preferably by large angle and low energy implantation. The in situ doping steps provide uniform doping profile compared to implantation. It is also easier to design the process for a desired device.

The diodes can be formed by steps comprising forming the layers and patterning and etching the formed layers. Alternatively, the diodes can be formed by steps comprising forming a dielectric layer with openings and depositing semiconductor materials into the dielectric openings. The fabrication techniques are described in detail in previously filed U.S. application Ser. No. 12/007,780 and U.S. application Ser. No. 12/007,781, both filed on Jan. 15, 2008, which are hereby incorporated by reference in their entirety and can be used in the practice of the various embodiments described herein.

One embodiment of this invention provides a monolithic three dimensional memory array comprising memory cells where each memory cell comprises a diode with one or more halo regions. A monolithic three dimensional memory array is one in which multiple memory levels are formed above a single substrate, such as a wafer, with no intervening substrates. The layers forming one memory level are deposited or grown directly over the layers of an existing level or levels. A monolithic three dimensional memory array formed above a substrate comprises at least a first memory level formed at a first height above the substrate and a second memory level formed at a second height different from the first height. Three, four, eight, or indeed any number of memory levels can be formed above the substrate in such a multilevel array.

Based upon the teachings of this disclosure, it is expected that one of ordinary skill in the art will be readily able to practice the present invention. The descriptions of the various embodiments provided herein are believed to provide ample insight and details of the present invention to enable one of ordinary skill to practice the invention. Although certain supporting circuits and fabrication steps are not specifically described, such circuits and protocols are well known, and no particular advantage is afforded by specific variations of such steps in the context of practicing this invention. Moreover, it is believed that one of ordinary skill in the art, equipped with the teaching of this disclosure, will be able to carry out the invention without undue experimentation.

The foregoing details description has described only a few of the many possible implementations of the present invention. For this reason, this detailed description is intended by way of illustration, and not by way of limitations. Variations and modifications of the embodiments disclosed herein may be made based on the description set forth herein, without departing from the scope and spirit of the invention. It is only the following claims, including all equivalents, that are intended to define the scope of this invention.

What is claimed is:

1. A semiconductor diode device, comprising:
    a first conductivity type region;
    a second conductivity type region, wherein the second conductivity type is different from the first conductivity type;
    an intrinsic region located between the first conductivity type region and the second conductivity type region;
    a first halo region of the first conductivity type located between the second conductivity type region and the intrinsic region, the first halo region directly contacting the second conductivity region;
    wherein the first conductivity type region and the second conductivity type region of the diode device have a thickness ranging from 5 angstroms to 1 micron;
    wherein the first halo region has a thickness ranging from 10 angstroms to 3 microns,
    wherein the semiconductor diode device is a two terminal device,
    wherein the first conductivity type region, second conductivity type region, intrinsic region and first halo region have a cylindrical shape, and
    wherein a doping concentration of the first conductivity type region and doping concentration of second conductivity type region are higher than $1 \times 10^{19}$ cm$^{-3}$ and a doping concentration of the first halo region is higher than $1 \times 10^{17}$ cm$^{-3}$ and lower than $1 \times 10^{19}$ cm$^{-3}$.

2. A device of claim 1, further comprising a second halo region of the second conductivity type located between the first conductivity type region and the intrinsic region.

3. A device of claim 1, wherein the first halo region is lightly doped, and wherein the first conductivity type region and the second conductivity type region are heavily doped.

4. A device of claim 1, wherein:
    the first conductivity type region and the second conductivity type region have a thickness ranging from 200 angstroms to 500 angstroms;
    the intrinsic region has a thickness ranging from 1500 angstroms to 2500 angstroms; and
    the first halo region has a thickness ranging from 100 angstroms to 300 angstroms.

5. A device of claim 4, wherein:
    the diode is selected from a group consisting of $p^+$-$n^-$-i-$n^+$ semiconductor diode, $p^+$-i-$p^-$-$n^+$ semiconductor diode, $p^+$-$n^-$-i-$p^-$-$n^+$ semiconductor diode, $n^+$-i-$n^-$-$p^+$ semiconductor diode, $n^+$-$p^-$-i-$p^+$ semiconductor diode, and $n^+$-$p^-$-i-$n^-$-$p^+$ semiconductor diode;
    the first conductivity type region, first halo region, intrinsic region, and second conductivity type region of the diode are arranged vertically in series.

6. A nonvolatile memory device, comprising: at least one memory cell which comprises a steering element and a storage element, wherein the steering element comprises the diode of claim 1; and a first electrode and a second electrode electrically contacting the at least one memory cell.

7. A device of claim 6, wherein the memory cell type is selected from at least one of antifuse, fuse, diode and antifuse arranged in a series, polysilicon memory effect cell, metal oxide memory, switchable complex metal oxide, carbon nanotube memory, graphene switchable resistance material, phase change material memory, conductive bridge element, or switchable polymer memory.

8. A device of claim 6, wherein the storage element comprises a resistivity switching element.

9. A device of claim 8, wherein the resistivity switching element comprises a metal oxide antifuse dielectric layer.

10. A device of claim 9, wherein the diode and the metal oxide antifuse dielectric layer are arranged in series between the first and the second electrodes.

11. A device of claim 6, wherein the memory cell is a read/write memory cell or a rewritable memory cell.

12. A device of claim 6, wherein the nonvolatile memory device comprises a monolithic, three dimensional array of memory cells.

* * * * *